(12) United States Patent
Berkovich et al.

(10) Patent No.: US 10,914,793 B2
(45) Date of Patent: Feb. 9, 2021

(54) METHOD AND SYSTEM FOR MAGNETOMETER CALIBRATION

(71) Applicant: InvenSense, Inc., San Jose, CA (US)

(72) Inventors: Gennadii Berkovich, Calgary (CA); Dmitry Churikov, Calgary (CA)

(73) Assignee: InvenSense, Inc., San Jose, CA (US)

( * ) Notice: Subject to any disclaimer, the term of this patent is extended or adjusted under 35 U.S.C. 154(b) by 311 days.

(21) Appl. No.: 16/182,573

(22) Filed: Nov. 6, 2018

(65) Prior Publication Data

US 2020/0142008 A1 May 7, 2020

(51) Int. Cl.
*G01R 33/00* (2006.01)
*G01R 33/028* (2006.01)

(52) U.S. Cl.
CPC ..... *G01R 33/0017* (2013.01); *G01R 33/0035* (2013.01); *G01R 33/0286* (2013.01)

(58) Field of Classification Search
CPC ............ G01R 33/0286; G01R 33/0035; G01R 33/0206
See application file for complete search history.

(56) References Cited

U.S. PATENT DOCUMENTS

| 10,337,884 B2* | 7/2019 | Wahdan | G01C 17/38 |
| 2013/0179074 A1* | 7/2013 | Haverinen | G06F 17/00 |
| | | | 701/525 |
| 2014/0357305 A1* | 12/2014 | Haverinen | G01C 17/38 |
| | | | 455/456.6 |

* cited by examiner

*Primary Examiner* — Alvaro E Fortich
(74) *Attorney, Agent, or Firm* — Bay Area Technology Law Group PC

(57) ABSTRACT

Systems and methods are disclosed for automatically calibrating a magnetometer during user activity. A portable device associated with a user provides magnetic field measurements during user activity, which are converted to a frequency domain and frequency component(s) that correspond to the user activity are distinguished. A criterion is defined for the distinguished frequency components such that magnetometer bias is estimated by satisfying a condition for the criterion. Accordingly, the estimated magnetometer bias may be applied to the obtained magnetic field measurements. The calibrated magnetic field measurements may be used for any suitable purposes, including for building a magnetic fingerprint map using crowdsourcing techniques.

23 Claims, 10 Drawing Sheets

METHOD AND SYSTEM FOR MAGNETOMETER CALIBRATION

FIELD OF THE PRESENT DISCLOSURE

This disclosure generally relates to techniques for calibrating the magnetometer of a portable device and more particularly to calibrating such a magnetometer during natural motion of the portable device and without requiring intentional interaction from a user.

BACKGROUND

The development of relatively economical Micro Electro-Mechanical Systems (MEMS) sensors has enabled the incorporation of a wide variety of sensors into mobile devices, such as cell phones, laptops, tablets, gaming devices and other portable, electronic devices. Non-limiting examples of such sensors include inertial sensors such as an accelerometer and/or a gyroscope, as well as other types of sensors, such as a magnetometer, a pressure sensor, a microphone, a proximity sensor, an ambient light sensor, an infrared sensor, and the like. Further, sensor fusion processing may be performed to combine the data from a plurality of sensors to provide an improved characterization of the device's motion or orientation, providing useful information suitable for use in a wide variety of applications, including personal navigation. However, due to the nature of electronics and mechanics, MEMS-based and other sensors may be prone to having bias (offset) and sensitivity errors. These errors may drift and or change due to temperature, humidity, time, assembly stress and other changes in peripheral conditions. In turn, inaccurate bias may result in decreased quality of sensor data and the calculation of any values dependent on the precision of the sensors' outputs. For example, magnetometer measurements may be subject to hard- and soft-iron distortions induced by device characteristics, e.g. a printed circuit board, and/or distortions resulting from external environmental conditions and consequently require periodic calibration to achieve the desired accuracy of measurement of geomagnetic fields.

Accordingly, it may be desirable to perform a sensor calibration operation to characterize the bias or sensitivity error, enabling a correction of the sensor data. A sensor bias or sensitivity is produced by the calibration operation, which may then be applied to the raw sensor data and calibrate the sensor. As will be appreciated, the calibration operation may be performed during manufacture or may be performed periodically while the device is being used to account for changes that may occur over time. Typically, the calibration operation performed to improve the quality of data obtained from the sensor is achieved by positioning the device in one or more specific orientations or moving the device in a particular pattern of motion. However, even if a user has knowledge of the orientations or patterns, it may be difficult to accurately reproduce them as well as representing a delay and requiring involvement, both of which negatively affect the user's experience. Further, a user may not be aware when a calibration operation has been successfully completed or when accuracy of a sensor has degraded to the point a calibration operation is warranted.

As noted above, the sensors of a portable device may be used in a wide variety of applications and the value of the information they provide necessarily depends on how effectively they have been calibrated. One illustration may be appreciated in the context of the desirability of mobile or portable electronic devices having location awareness capabilities. An expanding variety of technologies have been developed to provide a device with information about its location, allowing it to selectively deliver information based on its location context or to otherwise adapt its operation. Common examples include navigation aids that may be used to guide a user to a desired destination, dispatch of emergency services, social networking applications that may inform the user about others that may be in proximity, targeted advertising schemes that may provide information relative to the user's location or tracking utilities that may provide real time information about a user's whereabouts.

In some cases, a portable device may have position determination capabilities in the form of a Global Navigation Satellite System (GNSS) that, under the proper conditions, may provide precise information about the geographic location of the device. However, GNSS performance may be subject to degradation when visibility of the satellites is reduced. For example, use of GNSS in an indoor environment may lengthen the time needed to obtain the necessary fix on the satellites or may prevent it entirely. Common alternatives or supplements to GNSS include self-contained motion sensors, such as MEMS inertial sensors, barometers and magnetometers. Reference-based techniques, such as GNSS, and self-contained sensors can be integrated to provide promising positioning results in most outdoor environments. However, some mass market applications require seamless positioning capabilities in all kinds of environments such as malls, offices or underground parking lots. In the absence of GNSS signals in indoor environments, an Inertial Navigation System (INS) may be used by employing techniques such as dead-reckoning to help determine position. Nevertheless, sensor-based techniques may fail to provide adequate performance by themselves, particularly over longer durations due to significant performance degradation from the accumulating sensor drifts and bias. As such, positioning technologies relying solely on motion sensors may not satisfy all requirements for seamless indoor and outdoor navigation applications. As a result, alternative positioning techniques that can provide strong coverage in areas where access to other reference-based positioning is degraded or denied have been developed.

One class of such techniques is known as "fingerprinting," and relies on recording patterns of signals, such as e.g. electromagnetic wireless signals, at known locations within an area for which position information may be desired. When a device subsequently measures a pattern of received signals that is correlated with a known location, that location may be used to determine the position of the device and/or to aid another positioning technique, such as through integration with the INS techniques noted above. With particular regard to this disclosure, environmental signals in the form of magnetic field measurements may be used as the basis for creating a fingerprint map. Magnetic fingerprint-based positioning offers a number of compelling advantages because it is infrastructure-free and benefits from the long-term stability of magnetic fields inside a building.

As noted, a fingerprint database must be built to correlate magnetic signal patterns with known locations. Unfortunately, building these databases is a time-consuming and resource-intensive procedure. Generally, one or more surveys are performed so that magnetometer readings are collected at desired positions inside a building at a useful resolution, such as by taking readings at locations separated by a given distance, for example, 1 or 2 meters, and then estimating the magnetic field patterns in those positions by processing magnetometer readings. Such systematic surveys of magnetic fields in a building may be performed by moving along predetermined routes with portable devices to record the measurements. One approach to collecting the necessary magnetic data that seeks to reduce or eliminate the need for dedicated surveys is based on use of everyday activity of a plurality of persons inside a building undergoing normal behavior, such as shopping in a retail mall or progressing between gates and other locations in an airport, by "crowdsourcing." Given the widespread adoption of capable portable devices, such as smart phones, a suitable device associated with each person may passively record multiple magnetic field measurements without requiring any change in behavior. These methods are typically known as crowdsourcing and represent an opportunity to acquire the necessary data without performing special surveys of the area being fingerprinted.

However, regardless of whether the necessary magnetic field data is acquired through dedicated surveys, through crowdsourcing or through a combination of these or other techniques, errors of various types may affect the accuracy of the resulting fingerprint map. Indeed, a significant concern during collection of magnetic field measurements for fingerprinting is ensuring the measuring device is adequately calibrated. As discussed above, conventional approaches for calibration may be reliant on actions performed locally for each measuring device, such as by requiring the user to perform a specific routine. Such approaches may not be feasible in a crowdsourcing application that is based on everyday activity of plurality of persons moving through a venue, as it may not be possible to ensure that each device has been subjected to sufficient calibration routines. Moreover, many typical magnetometer calibration techniques rely on an assumption of constancy of the geomagnetic field during the calibration process and/or an assumption of known geomagnetic field strength. Either of these assumptions may not be applicable during magnetic fingerprinting, particularly for indoor venues. Attempts to calibrate the magnetometer of a portable device while the user is walking inside a building suffer from geomagnetic field distortions caused by metallic construction of the building which preclude the necessary field constancy. Likewise, the geomagnetic field strength at any given indoor location may be unknown, as this is the measurement that must be collected to build the magnetic fingerprint map. Further, depending on how the calibration is performed, the operation may be computationally expensive and may interfere with the ability of the portable device to perform other actions and/or may reduce battery life, and these characteristics may make a portable device user reluctant to participate in a crowdsourcing.

Accordingly, the techniques of this disclosure, although applicable to the local calibration of individual devices, may be used to calibrate magnetometer data from a plurality of portable devices. One example of using these techniques is to obtain more accurate information for the construction of magnetic fingerprinting maps, but the techniques may be applied whenever more accurate magnetometer data is desired. These and other advantages are described in the following materials.

SUMMARY

This disclosure includes a method for automatically calibrating a magnetometer during user activity. The method may involve providing at least one portable device having an integrated sensor for obtaining sensor data comprising magnetic field measurements, wherein the portable device is associated with a user. Magnetic field measurements obtained from the integrated sensor of the portable device during the user activity may be processed by converting the obtained magnetic field measurements to a frequency domain, distinguishing at least one frequency component in the converted magnetic field measurements that corresponds to the user activity, defining a criterion for the distinguished frequency component and estimating a magnetometer bias by satisfying a condition for the criterion, so that the estimated magnetometer bias may be applied to the obtained magnetic field measurements.

The disclosure also includes a portable device that may be associated with a user which has an integrated sensor for obtaining sensor data comprising magnetic field measurements during user activity and at least one processor configured to process the magnetic field measurements obtained from the integrated sensor of the portable device to automatically calibrate the integrated sensor by converting the obtained magnetic field measurements to a frequency domain, distinguishing at least one frequency component in the converted magnetic field measurements that corresponds to the user activity, defining a criterion for the distinguished frequency component and estimating a magnetometer bias by satisfying a condition for the criterion, so that the processor may be further configured to apply the estimated magnetometer bias to the obtained magnetic field measurements.

This disclosure also includes a server for automatically calibrating a magnetometer. The server includes at least one processor configured to receive magnetic field measurements obtained by a portable device having an integrated sensor, wherein the portable device is associated with a user and wherein the magnetic field measurements were obtained from the integrated sensor of the portable device during user activity and process the received magnetic field measurements by converting the obtained magnetic field measurements to a frequency domain, distinguishing at least one frequency component in the converted magnetic field measurements that corresponds to the user activity, defining a criterion for the distinguished frequency component; and estimating a magnetometer bias by satisfying a condition for the criterion.

This disclosure also includes a system for automatically calibrating a magnetometer having a portable device with an integrated sensor for obtaining sensor data comprising magnetic field measurements during user activity, wherein the portable device is associated with a user and remote processing resources configured to process magnetic field measurements obtained from the integrated sensor of the portable device while the user traversed an indoor environment by converting the obtained magnetic field measurements to a frequency domain, distinguishing at least one frequency component in the converted magnetic field measurements that corresponds to the user activity, defining a criterion for the distinguished frequency component and estimating a magnetometer bias by satisfying a condition for the criterion, so that the estimated magnetometer bias may be applied to the obtained magnetic field measurements.

DETAILED DESCRIPTION

Figure 1:
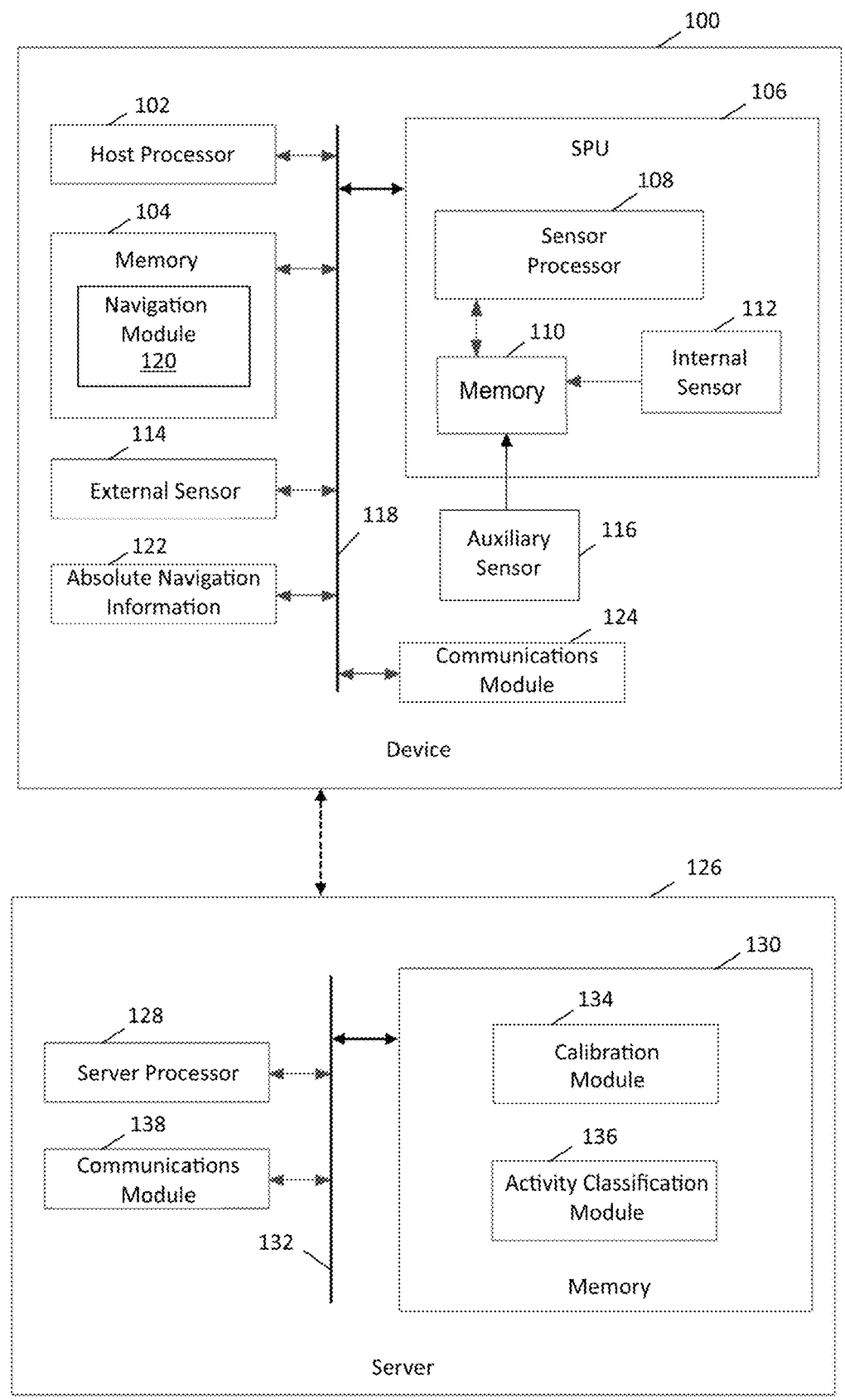
FIG. 1 is a schematic diagram of a magnetometer calibration system according to an embodiment.

At the outset, it is to be understood that this disclosure is not limited to particularly exemplified materials, architectures, routines, methods or structures as such may vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present disclosure and is not intended to represent the only exemplary embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and converts data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion processing units (MPUs), sensor processing units (SPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration.

Unless defined otherwise, all technical and scientific terms used herein have the same meaning as commonly understood by one having ordinary skill in the art to which the disclosure pertains.

Finally, as used in this specification and the appended claims, the singular forms "a", "an" and "the" include plural referents unless the content clearly dictates otherwise.

To help illustrate these aspects, one embodiment of a portable device 100 having a magnetometer for which magnetic field measurements may be calibrated is schematically depicted with high level schematic blocks in FIG. 1. As will be appreciated, device 100 may be implemented as a device or apparatus, such as a handheld device or wearable device that can be moved in space by a user and its motion, location and/or orientation in space therefore sensed. For example, such a handheld device may be a mobile phone (e.g., smartphone, cellular phone, a phone running on a local network, or any other telephone handset), tablet, personal digital assistant (PDA), video game player, video game controller, navigation device, wearable device (e.g., glasses, watch, belt clip), fitness tracker, virtual or augmented reality equipment, mobile internet device (MID), personal navigation device (PND), digital still camera, digital video camera, binoculars, telephoto lens, portable music, video or media player, remote control, or other handheld device, or a combination of one or more of these devices. Such devices may be associated with a platform that conveys the device. The platform may be a human user, as in the example of a smartphone being carried. The platform may also be considered a vehicle or vessel that conveys the device. Alternatively, the platform itself may be automated and may convey the device without the need for a human operator. As an illustration in the context of constructing magnetic fingerprinting maps, the device may be dedicated to the function of surveying and in some embodiments may be capable of automated motion on its own without a separate platform. Accordingly, the dedicated device may be propelled or guided by a human surveyor or may be automated, such as in the form of a robot or drone.

Although the device may be transported or conveyed in the direction of movement of the platform depending on the embodiment, its orientation may not be constrained. Returning to the example of the smartphone, it may be held in the user's hand and employed in a variety of orientations or carried in a pocket, holster, bag or other manners. In other examples, the device may be strapped to the platform, such as with a vehicle mount, or may be non-strapped. When non-strapped, the mobility of the device may be constrained or unconstrained within the platform and as a result, circumstances may exist such that the device can be tilted to any orientation with respect to the user or platform.

As shown, device 100 includes a host processor 102, which may be one or more microprocessors, central processing units (CPUs), or other processors to run software programs, which may be stored in memory 104, associated with the functions of device 100. Multiple layers of software can be provided in memory 104, which may be any combination of computer readable medium such as electronic memory or other storage medium such as hard disk, optical disk, etc., for use with the host processor 102. For example, an operating system layer can be provided for device 100 to control and manage system resources in real time, enable functions of application software and other layers, and interface application programs with other software and functions of device 100. Similarly, different software application programs such as menu navigation software, games, camera function control, navigation software, communications software, such as telephony or wireless local area network (WLAN) software, or any of a wide variety of other software and functional interfaces can be provided. In some embodiments, multiple different applications can be provided on a single device 100, and in some of those embodiments, multiple applications can run simultaneously.

Device 100 includes at least one sensor assembly, as shown here in the form of integrated motion processing unit (MPU) or sensor processing unit (SPU) 106 featuring sensor processor 108, memory 110 and internal sensor 112. The various component of SPU 106 may also use a bus-like architecture for communication. Memory 110 may store algorithms, routines or other instructions for processing data output by internal sensor 112 and/or other sensors as described below using logic or controllers of sensor processor 108, as well as storing raw data and/or motion data output by internal sensor 112 or other sensors. Internal sensor 112 may be one or more sensors for measuring motion of device 100 in space as described below, including inertial sensors. In order to provide magnetic field measurements, internal sensor 112 may include a magnetometer, but in alternative embodiments, other sensors of device 100 may provide the magnetometer functionality as described below. Depending on the configuration, SPU 106 measures one or more axes of rotation and/or one or more axes of acceleration of the device. In one embodiment, internal sensor 112 may include rotational motion sensors or linear motion sensors. For example, the rotational motion sensors may be gyroscopes to measure angular velocity along one or more orthogonal axes and the linear motion sensors may be accelerometers to measure specific forces along one or more orthogonal axes. In one aspect, three gyroscopes and three accelerometers may be employed, such that a sensor fusion operation performed by sensor processor 108, or other processing resources of device 100, combines data from internal sensor 112 to provide a six axis determination of motion. As desired, internal sensor 112 may be implemented using Micro Electro Mechanical System (MEMS) to be integrated with SPU 106 in a single package. As noted above, internal sensor 112 may also include a magnetometer that measures along three orthogonal axes which, in addition to collecting magnetic field measurements for embodiments related to building a fingerprint map or any other purpose, may provide output data to be fused with the gyroscope and accelerometer inertial sensor data to provide a nine axis determination of motion. Exemplary details regarding suitable configurations of host processor 102 and SPU 106 may be found in co-pending, commonly owned U.S. patent application Ser. No. 11/774,488, filed Jul. 6, 2007, and U.S. patent application Ser. No. 12/106,921, filed Apr. 11, 2008, which are hereby incorporated by reference in their entirety. Suitable implementations for SPU 106 in device 100 are available from InvenSense, Inc. of San Jose, Calif.

Alternatively or in addition, device 100 may implement a sensor assembly in the form of external sensor 114. The external sensor may represent one or more sensors as described above, such as an accelerometer and/or a gyroscope, which output data for use in deriving a position. As used herein, "external" means a sensor that is not integrated with SPU 106. Also alternatively or in addition, SPU 106 may receive data from an auxiliary sensor 116 configured to measure one or more aspects about the environment surrounding device 100 and may be integrated with the SPU. At least one of external sensor 114 and auxiliary sensor 116 includes a magnetometer if one is not provided in the form of internal sensor 112 or optionally may include a supplemental magnetometer. As desired, either external sensor 114 or auxiliary sensor 116 (or internal sensor 112) may also include a barometer to provide an altitude determination that may be fused with the other sensor data to provide a ten axis determination of motion. Although described in the context of one or more sensors being MEMS based, the techniques of this disclosure may be applied to any sensor design or implementation.

In the embodiment shown, host processor 102, memory 104, SPU 106 and other components of device 100 may be coupled through bus 118, which may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. For example, additional buses may be used to couple the various components of device 100, such as by using a dedicated bus between host processor 102 and memory 104.

In one aspect, the various operations of this disclosure used to derive a navigation solution comprising at least the position and orientation for device 100 as the magnetic measurements are collected may be implemented through navigation module 120 as a set of suitable instructions stored in memory 104 that may be read and executed by host processor 102. The navigation solution may include any suitable information related to the position, motion and/or orientation of portable device 100. Although discussed primarily in the context of dead reckoning, which may be considered a self-contained strategy, navigation module 120 may employ a reference-based strategy, another self-contained strategy, or any combination of strategies to provide any desired degree of location awareness capabilities. For example, navigation module 120 may employ inertial navigation techniques utilizing sensor data, such as from internal sensor 112 and/or external sensor 114, as obtained for a current sensor epoch to derive a navigation solution for that epoch.

Optionally, navigation module 120 may also use a source of absolute navigation information 122 for use with a reference-based strategy, such as a Global Navigation Satellite System (GNSS) receiver, including without limitation the Global Positioning System (GPS), the Global Navigation Satellite System (GLONASS), Galileo and/or Beidou, as well as WiFi™ positioning, cellular tower positioning, Bluetooth™ positioning beacons or other similar methods when deriving a navigation solution. This is optional and not required in all embodiments. Navigation module 120 may also be configured to use information from a wireless communication protocol to provide a navigation solution determination using signal trilateration. Any suitable protocol, including cellular-based and wireless local area network (WLAN) technologies such as Universal Terrestrial Radio Access (UTRA), Code Division Multiple Access (CDMA) networks, Global System for Mobile Communications (GSM), the Institute of Electrical and Electronics Engineers (IEEE) 802.16 (WiMAX), Long Term Evolution (LTE), IEEE 802.11 (WiFi™) and others may be employed. Further, device 100 typically includes a communications module 124 for transmitting and/or receiving information, which may include the positions and orientations derived by navigation module 120 and/or magnetic field measurements, such as those corresponding to the determined positions.

Multiple layers of software may be employed as desired and stored in any combination of memory 104, memory 110, or other suitable location. For example, a motion algorithm layer can provide motion algorithms that provide lower-level processing for raw sensor data provided from the motion sensors and other sensors. A sensor device driver layer may provide a software interface to the hardware sensors of device 100. Further, a suitable application program interface (API) may be provided to facilitate communication between host processor 102 and SPU 106, for example, to transmit desired sensor processing tasks.

In this exemplary system, device 100 communicates sensor data, including the magnetic signals being recorded, and/or navigation solutions derived to server 126. In some embodiments as noted above, device 100 determines navigation solutions in real-time as a user moves through an environment with device 100. Alternatively, only raw sensor data may be sent to server 126, which may derive the positions of device 100 and correlate them with the recorded wireless signals for applications related to building magnetic fingerprinting maps or for any other suitable purpose. In other applications that do not require knowledge of the position of device 100, the magnetic field measurements alone may be sufficient. When the position determinations are performed by server 126, they may also be derived in real-time, given any communication delay, or may be performed at a subsequent time. One suitable architecture of server 126 is depicted using high level schematic blocks in FIG. 1, and may include server processor 128 that is in communication with memory 130 over bus 132. As will be described in further detail below, server processor 128 may execute instructions stored in memory 130, including those represented by calibration module 134.

In some embodiments, server 126 (or device 100 as indicated below) may implement activity classification module 136 as instructions stored in memory 130 that are executed by server processor 128 or any other suitable architecture. Using known techniques, sensor data such as that described above with regard to portable device 100 and/or other information may be used to determine the type of activity being performed by the user of the device. A representative example of such teachings is commonly-owned, co-pending U.S. patent application Ser. No. 14/464,999, filed Aug. 21, 2014 and titled "System and Method for Activity Classification," which is hereby incorporated by reference in its entirety. As will be appreciated, some classified activities may be expected to create sufficient repetitive changes in device orientation to allow application of the techniques of this disclosure. Correspondingly, when activity classification module 136 determines the user is engaged in an activity having the requisite characteristics, a calibration may be performed. As one illustration, walking may be one of the classified activities that is expected to cause the necessary motion characteristics in portable device 100. In another aspect, the classified activity may also indicate an appropriate range of frequencies that correspond to the frequency components that correspond to the user activity as discussed below.

Server 126 may also include a communications module 138 to receive raw sensor data or navigation solutions for device 100 derived by navigation module 120. Communications between device 100 and server 126 may employ any suitable protocol. For example, a shorter range, low power communication protocol such as BLUETOOTH®, ZigBee®, ANT or a wired connection may be used or a longer range communication protocol, such as a transmission control protocol, interne protocol (TCP/IP) packet-based communication, accessed using a wireless local area network (WLAN), cell phone protocol or the like may be used. In general, the system depicted in FIG. 1 may embody aspects of a networked or distributed computing environment. Device 100 and server 126 may communicate either directly or indirectly, such as through multiple interconnected networks. As will be appreciated, a variety of systems, components, and network configurations, topologies and infrastructures, such as client/server, peer-to-peer, or hybrid architectures, may be employed to support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the techniques as described in various embodiments.

Any or all of the functions described with respect to device 100 and server 126 may be performed by any number of discrete devices in communication with each other, or may be performed by device 100 itself in other suitable system architectures. Accordingly, it should be appreciated that any suitable division of processing resources may be employed whether within one device or among a plurality of devices. Further, aspects implemented in software may include but are not limited to, application software, firmware, resident software, microcode, etc., and may take the form of a computer program product accessible from a computer-usable or computer-readable medium providing program code for use by or in connection with a computer or any instruction execution system, such as host processor 102, sensor processor 108, server processor 128, a dedicated processor or any other processing resources of device 100, server 126 or other remote processing resources, or may be implemented using any desired combination of software, hardware and firmware. For example, even though the techniques of this disclosure are particularly suitable for calibrating measurements obtained from device 100 remotely, such as to enable the magnetic field measurement information collected by device 100 to be used for constructing more accurate fingerprinting maps and/or to provide estimated magnetometer biases to device 100 to allow local compensation of magnetic field measurements, the techniques may also be performed to estimate magnetometer biases locally for any suitable purpose. As such, device 100 may implement the functions of calibration module 134 and/or activity classification module 136 using host processor 102 and memory 104 or any other suitable local resources.

Figure 2:
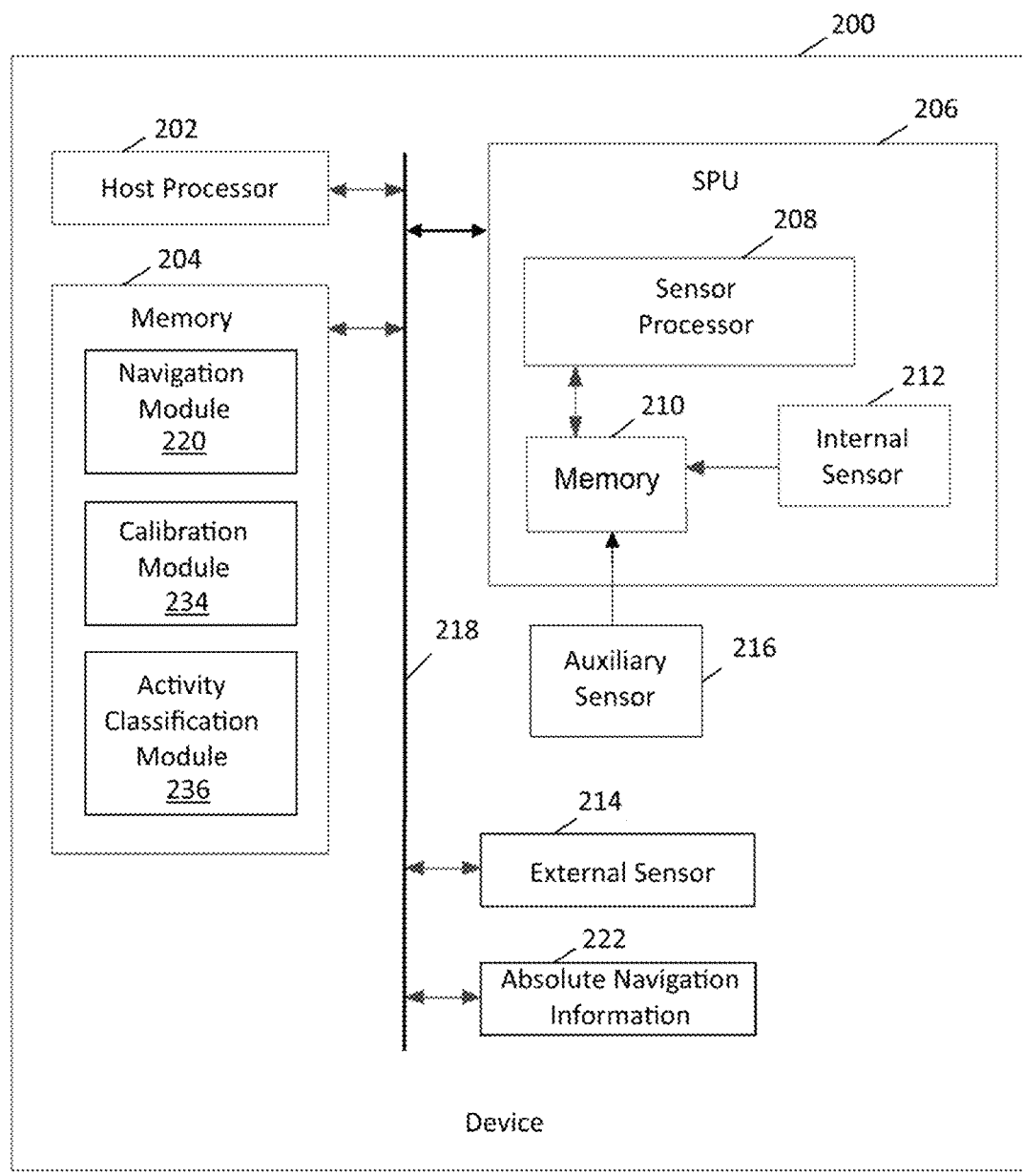
FIG. 2 is a schematic diagram of device configured to calibrate a magnetometer locally according to an embodiment.

An example of such an architecture is schematically depicted in FIG. 2, in which portable device 200 is configured to estimate magnetometer biases according to the techniques of this disclosure locally. Similar components have corresponding reference numbers (such as, portable device 100 of FIG. 1 may correspond to portable device 200 of FIG. 2). Accordingly, portable device 200 includes a host processor 202, which may be one or more microprocessors, central processing units (CPUs), or other processors to run software programs, which may be stored in memory 204, associated with the functions of device 200. Multiple layers of software can be provided in memory 204. Device 200 includes at least one sensor assembly, as shown here in the form of integrated motion processing unit (SPU) 206 featuring sensor processor 208, memory 210 and internal sensor 212. Memory 210 may store algorithms, routines or other instructions for processing data output by internal sensor 212 and/or other sensors as described below using logic or controllers of sensor processor 208, as well as storing raw data and/or motion data output by internal sensor 212 or other sensors. Internal sensor 212 may be one or more sensors for measuring motion of device 200 in space, such as a gyroscope and/or an accelerometer as described above. Device 200 may also implement a sensor assembly in the form of external sensor 214. This is optional and not required in all embodiments. Also alternatively or in addition, SPU 206 may receive data from an auxiliary sensor 216 configured to measure one or more aspects about the environment surrounding device 200. This is optional and not required in all embodiments. As noted above, at least one of internal sensor 212, external sensor and auxiliary sensor 116 includes a magnetometer. In the embodiment shown, host processor 202, memory 204, SPU 206 and other components of device 200 may be coupled through bus 218. Device 200 may also have a source of absolute navigation information 222, which is optional and not required in all embodiments. Examples of functional blocks which may be implemented by instructions stored in memory 204 for execution by processor 202 include navigational module 220, calibration module 234 and/or activity classification module 236. As will be appreciated, these or other functional modules may also be implemented using sensor processor 208 and memory 210 or any other local processing resources.

As discussed above, aspects of this disclosure include techniques having advantageous characteristic for calibrating the magnetometer of a portable device. For example, magnetic field measurements may be obtained from a portable device that is uncalibrated or is calibrated according to unknown standards or to unknown accuracy. Nevertheless, the techniques of this disclosure permit calibration of the magnetic field measurement after they have been recorded by the portable device. As used herein, the term calibration refers to the correction of magnetic field measurements by removing estimated biases. This may be performed remotely, by applying the techniques of this disclosure to magnetic field measurements obtained from a portable device. Alternatively or in addition, calibration may be performed locally by applying the estimated biases to the output of magnetometer at the device. The estimation of magnetometer biases, which is one aspect of the calibration, may be performed either locally or remotely as desired. Further, the techniques of this disclosure do not require that the magnetic field being measured be known or constant. As such, these techniques may applied under conditions that would preclude conventional approaches, such as when the measurements are within an indoor venue that may exhibit varying perturbations of the magnetic field due to metallic infrastructure elements or other causes. Moreover, the calibration may be performed locally by the portable device 100 itself, or the magnetic field measurements may be transmitted to remote processing resources, such as server 126, and the calibration performed on the measurements remotely. Still further, the techniques of this disclosure are automatic in that no intentional involvement of the user is required. Rather, the repetitive changes in device orientation discussed below result from the natural use of the device and/or movement of the user. The conditions necessary for performing calibration may be detected depending on the embodiment so that the techniques can be applied.

As will be appreciated, one illustrative example of the benefit provided by these characteristics is the building of magnetic fingerprint maps, particularly when using a crowdsourcing method that must be assumed to involve multiple, uncoordinated devices in varying states of calibration. However, the construction of magnetic fingerprint maps, whether by crowdsourcing or using other approaches should be recognized as a non-limiting example and the calibration of magnetic field measurements may be performed in conjunction with any other suitable purpose.

From the following materials, it will be appreciated that magnetic calibration of a portable device 100 may be based on converting a quantity of the magnetic field measurements made by a portable device to the frequency domain. In some embodiments, the magnetic field measurement are in three dimensions, such as may be obtained from a three-axis magnetometer as discussed above in the context of internal sensor 112, external sensor 114, auxiliary sensor 116 and/or others, and the quantity may be the magnitude in each orthogonal axis. Notably, the frequency spectrum of these converted readings has specific frequency components when the user employing the portable device 100 is moving or performing activities in a manner that has some degree of repetition. For the purposes of calibration, a significant relationship is that the amplitude of the frequency components is based at least in part on the biases of the magnetometer. In some embodiments, the better the calibration of the magnetometer, the smaller the frequency component(s). Accordingly, the techniques of this disclosure estimate magnetometer biases by defining a criterion to be satisfied with respect to the identified frequency components or range of frequencies. In one exemplary embodiment, the criterion is a minimization of the frequency components, although other optimizations may be performed depending on the selected criterion.

One clear example of the principle that a user may impart some repetitive change in orientation to a portable device is the motion exhibited during walking, which will be recognized as a common activity as a user of portable device 100 traverses between locations. Walking and other stepping motions such as jogging, running, climbing or descending stairs, and the like are known to be characterized by motions in one or more axis relative to the user that occur with sufficient regularity to produce identifiable frequency components. By applying the techniques of this disclosure, the magnetic field measurements obtained while a user is walking may be calibrated. In the context of building a magnetic fingerprint map, magnetic field measurements will also be obtained at a desired periodicity to acquire information for positions along the trajectory. However, it is important to recognize that many other user activities or behaviors also result in motion having sufficient repetition to create these frequency components that allow for calibration of the magnetometer information. For example, the gestures of a user may also cause sufficient repetitive motion in a portable device associated with the user.

Figure 8:
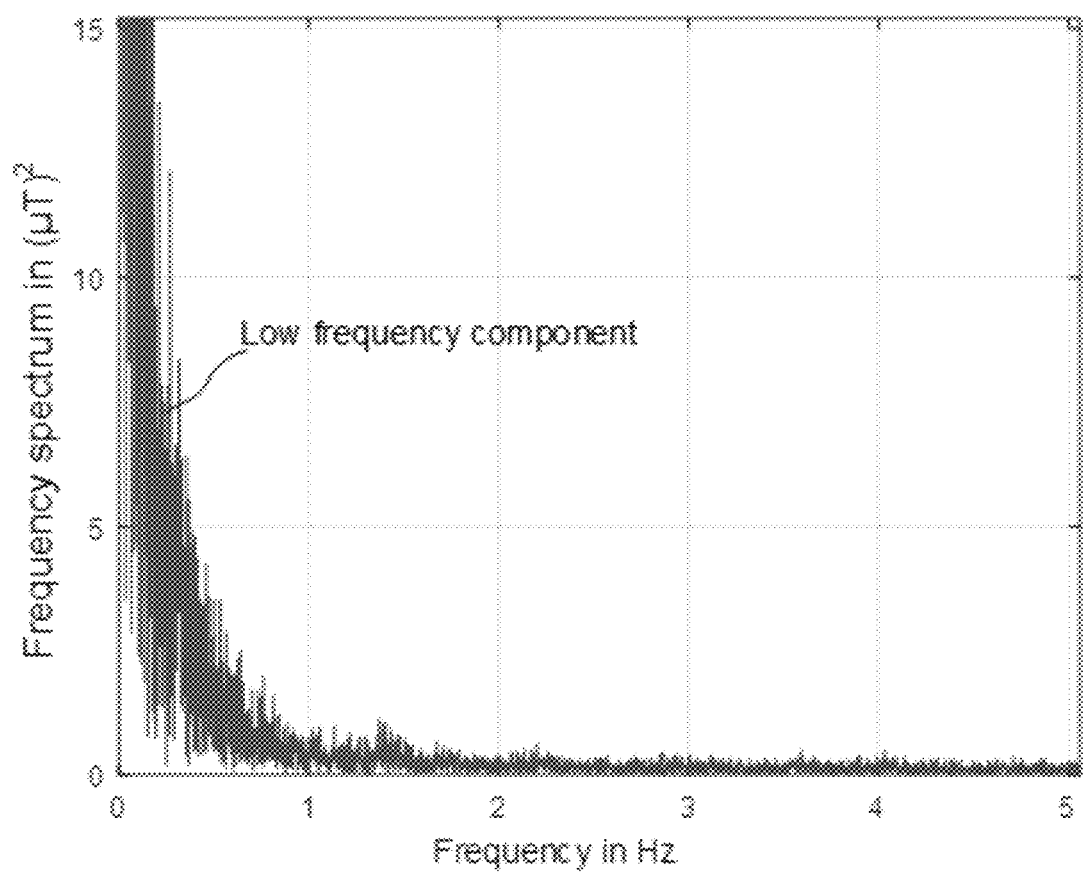
FIG. 8 is a graphical representation of the periodogram estimation of frequency components of the squared magnitudes of FIG. 5 following calibration, according to an embodiment.

According to this disclosure, the magnetometer calibration may be considered automatic because it leverages the unprompted and/or unscripted motion of the user to perform the calibration and does not require that the use perform a predefined pattern of motion, such as a FIG. 8 or rotations about the axes of the device frame used by conventional techniques. Rather, the necessary repetitive motion of the user occurs naturally as the user employs the portable device normally without performing actions specific to a calibration routine. As used herein, the term "user activity" refers to either normal usage of the portable device for purposes other than an intentional calibration routine or any other activity of the user that causes motion of the device, even if the user is not directly employing the device. In both cases, user activity includes a sufficient degree of repetitive motion to generate frequency components that correspond to the user activity that are distinguishable from changes in magnetic field measurements that would be caused by the changes in the magnetic field itself, such as may occur when moving between different locations. As such, the system will automatically calibrate the magnetometer when the appropriate condition or context for such calibration, such as e.g. the user walking, is detected. In some embodiments, this procedure will only be activate when calibration is required. Therefore, the system may send an interrupt or raise a flag when calibration is required, and then the system with monitor for the appropriate condition or context.

The following equations help illustrate the relationship between the frequency components and magnetometer bias.

Initially, the uncalibrated output of a three-axis magnetometer may be represented in terms of the magnetometer reading $\vec{v}_n = (v_{x,n}\ v_{y,n}\ v_{z,n})^T$ at time $t_n$, where $\vec{h}_n$ is 3D geomagnetic field in the Earth-fixed coordinates, $C_n$ is a 3 by 3 attitude matrix transforming the geomagnetic field from the Earth-fixed coordinates to a device frame, $\vec{b}_0 = (b_x\ b_y\ b_z)_0^T$ is the magnetometer bias, and is magnetometer measurement noise, as indicated by Equation (1):

$$\vec{v}_n = C_n \vec{h}_n + \vec{b}_0 + \vec{\xi}_n,\ n=0,\ldots,n-1 \quad (1)$$

With the simplification that magnetometer noise can be omitted due to the observation that this value is typically significantly smaller than other components, a reduced form of Equation (1) may be written as Equation (2):

$$\vec{v}_n \approx C_n \vec{h}_n + \vec{b}_0 \quad (2)$$

By setting $\vec{b}^*$ as an estimate of the magnetometer bias, the calibrated output of the magnetometer, corrected for the bias, may be expressed using Equation (3):

$$\vec{v}_n - \vec{b}^* = C_n \vec{h}_n + \vec{b}_0 - \vec{b}^* \quad (3)$$

Next, the squared magnitude of the calibrated form of $\vec{v}_n$ may be represented as indicated in Equation (4):

$$|\vec{v}_n - \vec{b}^*|^2 = |\vec{h}_n|^2 + |\vec{b}_0 - \vec{b}^*|^2 + 2\vec{h}_n^T C_n^T (\vec{b}_0 - \vec{b}^*) \quad (4)$$

Thus, when $\vec{b}^* = \vec{b}_0$, representing the condition when the magnetometer is accurately calibrated, the squared magnitude of the calibrated magnetometer output equals the squared magnitude of Earth's magnetic field as indicated in Equation (5) and therefore is independent of the orientation of the portable device:

$$|\vec{v}_n - \vec{b}_0|^2 = |\vec{h}_n|^2 \quad (5)$$

Conversely, when $\vec{b}^* \neq \vec{b}_0$, representing the condition when the magnetometer is not accurately calibrated, the squared magnitude of the magnetometer output does depend on the matrix $C_n$ as well as the resulting magnetometer bias error, $(\vec{b}_0 - \vec{b}^*)$.

Returning to Equation (4) and the squared calibrated magnetometer output, $|\vec{v}_n - \vec{b}^*|^2$, it may be noted that certain characteristics exist when the portable device is undergoing a degree of repetitive motion, including the example of a walking pedestrian. The first term of the right portion of Equation (4), $|\vec{h}_n|^2$, varies relatively slowly according to changing of the Earth's magnetic field while the pedestrian is walking. The second term, $|\vec{b}_0 - \vec{b}^*|^2$, does not vary at all. Finally, the last term, $2\vec{h}_n^T C_n^T (\vec{b}_0 - \vec{b}^*)$, changes more frequently than the first term, as a result of the repetitive motion, such as at the frequency of the stepping action. The periodical variations correspond to the changing device orientation matrix $C_n^T$ associated with each step. Thus, the last term of the right portion of Equation (4) varies faster than two other terms. This means that any error or inaccuracy in the magnetometer may be detected by activities that generate a change in the orientation of the device. Furthermore, if these activities are repetitive, signals corresponding to the frequency component(s) related to the repetitive activities can be detected in a frequency spectrum. Since this term depends on difference between a true and proposed magnetometer bias, $(\vec{b}_0 - \vec{b}^*)$, converting the squared magnitude of the magnetometer output, $|\vec{v}_n - \vec{b}^*|^2$, frequency domain may distinguish between the relatively high frequency last term of Equation (4) and the other low frequency terms so that the last term represents a definition of the magnetometer bias. This provides a convenient method for separating the contribution of the bias error in the frequency spectrum from other contributions.

Figure 3:
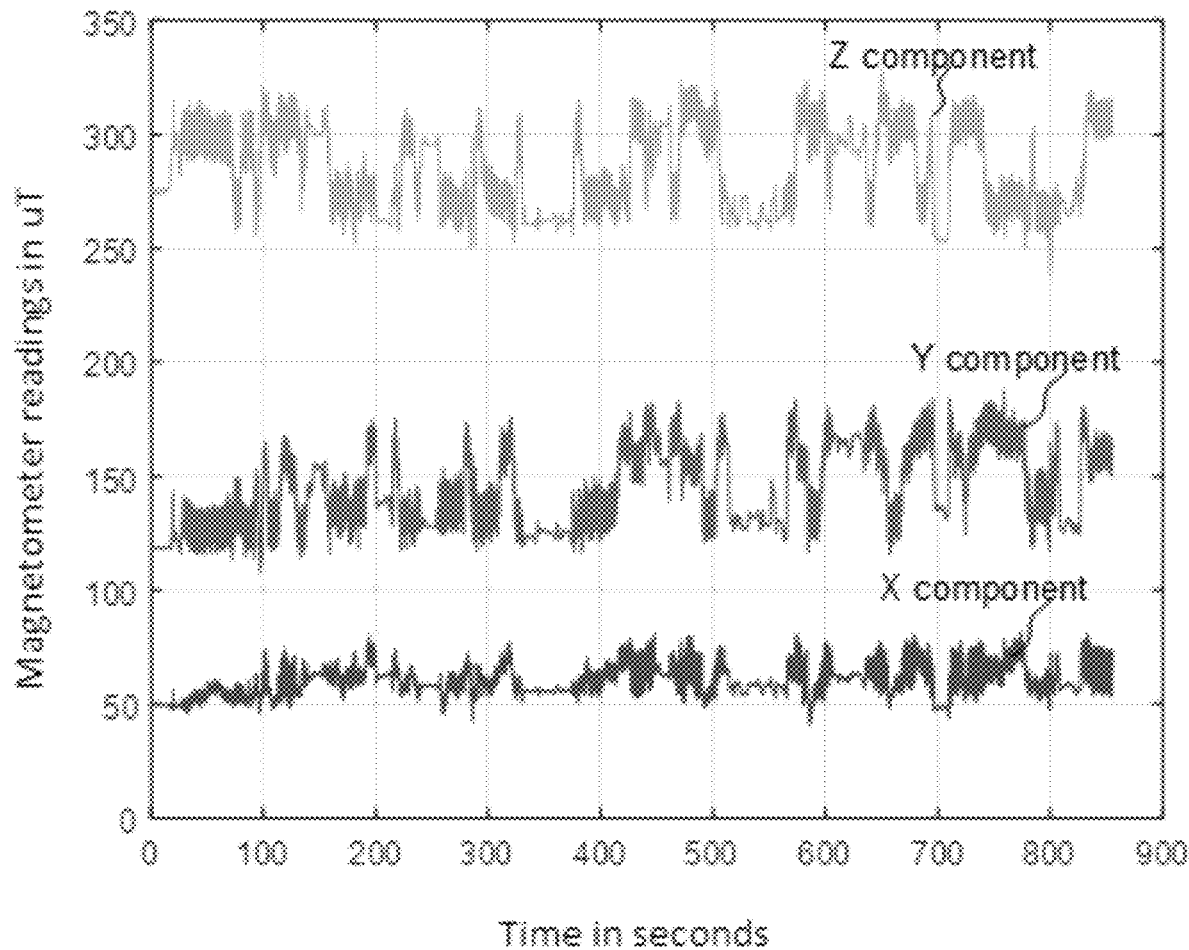
FIG. 3 is a graphical representation of uncalibrated magnetic field measurements obtained from a portable device, according to an embodiment.
Figure 4:
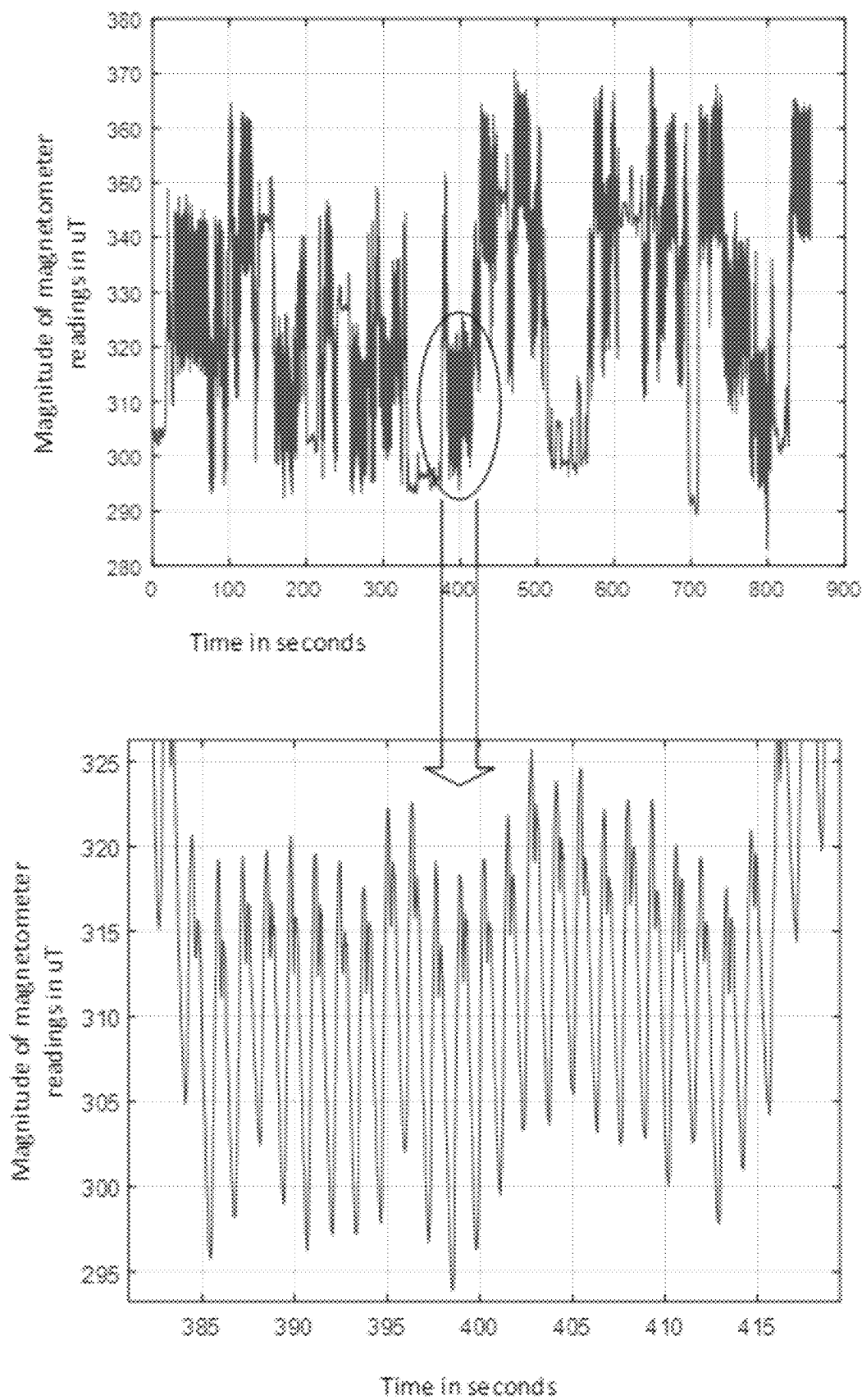
FIG. 4 is a graphical representation of the magnitudes of the measurements of FIG. 3, with the bottom view showing detail for the indicated portion of the top view.
Figure 5:
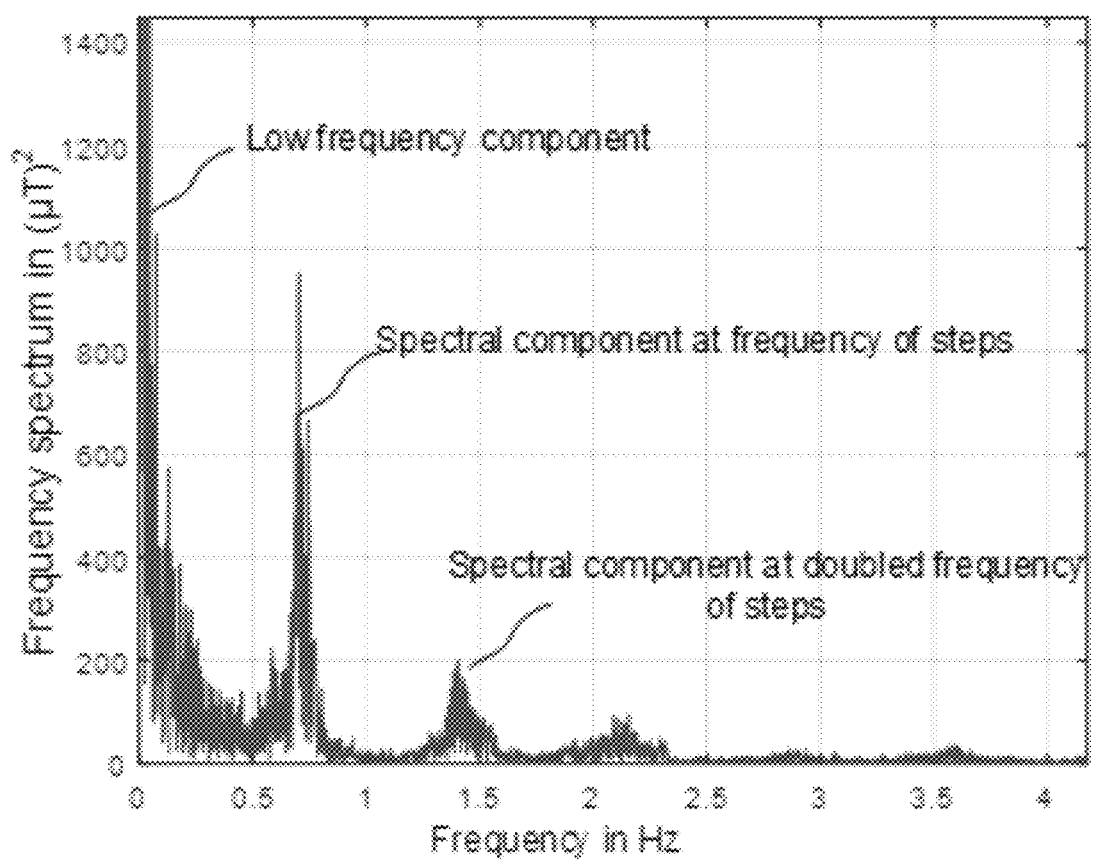
FIG. 5 is a graphical representation of a periodogram estimation of frequency components of the squared magnitudes shown in FIG. 3, according to an embodiment.

As an illustration of these concepts, FIG. 3 graphically depicts the uncalibrated magnetometer output $\vec{v}_n$ (in μT) from a portable device in a left pocket of a user during walking. Next, FIG. 4 graphically depicts the magnitude $|\vec{v}_n|$ of the readings from FIG. 3, with the bottom graph showing detail of the indicated area of the top graph. Particularly visible in the detail view is the periodic nature of the value, with each peak and trough corresponding to individual steps taken by the user. As will be appreciated, relatively less frequent changes in the magnitude may be attributed to movement within the venue and relatively more frequent changes in the magnitude may be attributed to steps of a pedestrian, as emphasized in the enlarged detail view. Correspondingly, FIG. 5 schematically depicts a periodogram estimating the frequency spectrum of the squared magnitude of the uncalibrated magnetometer readings of FIGS. 3 and 4. In different embodiments, other norms of the magnetic field measurements or other measures may be used as the quantity of the magnetic field measurements as desired. As shown, noticeable relatively high frequency spectral components exist at the step frequency, approximately 0.6-0.7 Hz, and at multiples of the step frequency. As discussed above, these contributions are due to an error in the magnetometer bias, and due to the changing orientation of the device by the repetitive activity, walking in this example, these frequency components can be detected in the frequency spectrum. From the above discussion, a criterion to be satisfied may be defined concerning these frequency components. In this exemplary embodiment, the relatively high frequency components may be minimized as discussed below, but other optimizations may be performed depending on the chosen criterion.

Figure 6:
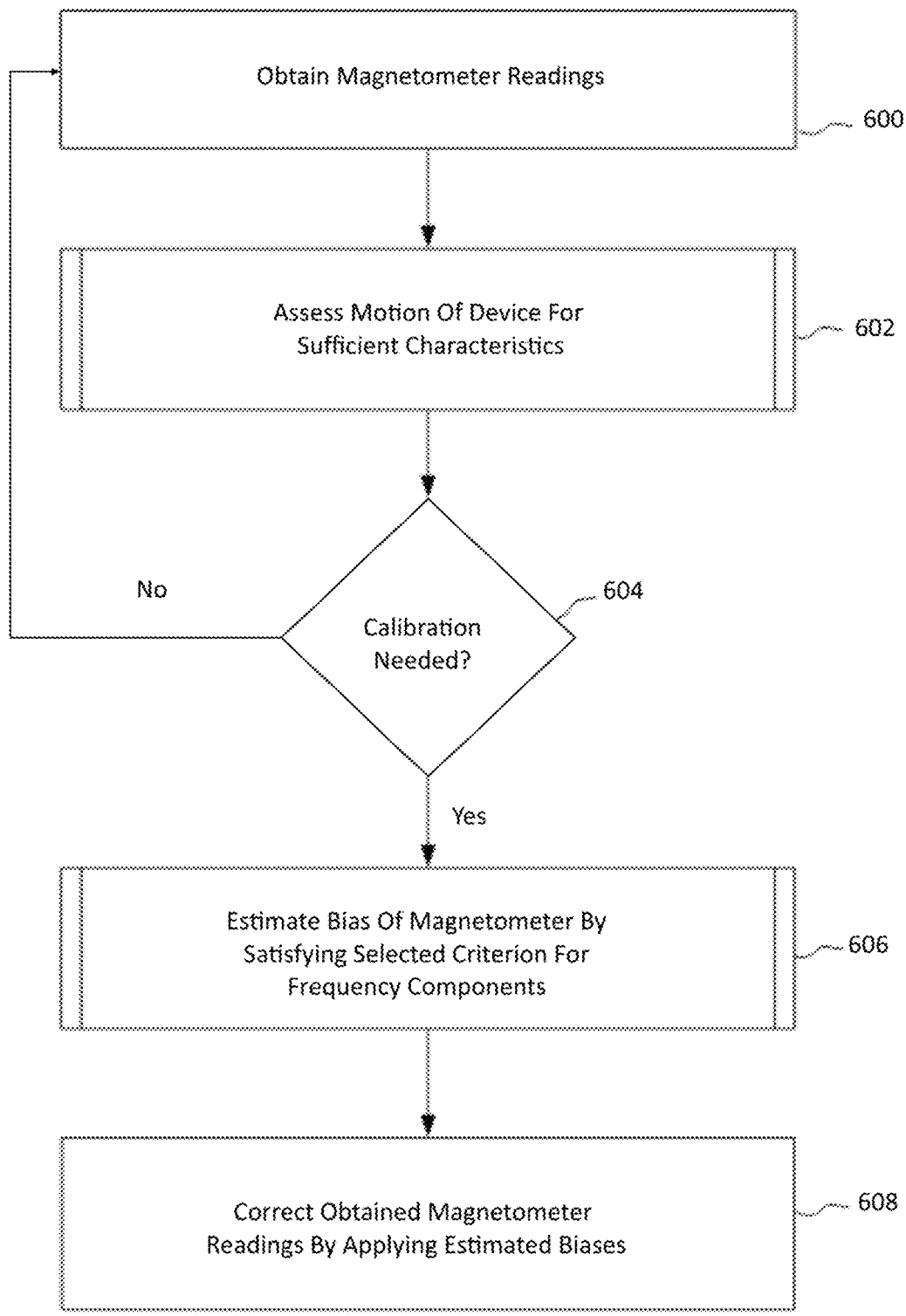
FIG. 6 is a flowchart showing a routine for performing automatic calibration of magnetic field measurements from the magnetometer of a portable device, according to an embodiment.

To help illustrate an exemplary implementation for calibrating a magnetometer of a portable device, FIG. 6 is a schematic flowchart of representative operations that may be performed by calibration module 134, 234 or other similar processing resource according to the techniques of this disclosure. A suitable routine may begin in 600 by obtaining magnetic field measurements, such as from portable device 100. As discussed above, the calibration may be performed locally, such as by portable device 200, or the uncalibrated measurements from portable device 100 may be sent to a remote processing resource, such as server 126 for calibration. It will be appreciated that whether the measurements are miscalibrated or are uncalibrated, the same functional result will be obtained. Conversely, if the measurements are already accurately calibrated, the criterion defined for the frequency components will also already be satisfied. As desired, additional processing may be performed on the obtained magnetic field measurements, e.g. down-sampling and filtering of the data. In one aspect, measurements collected during stops or other periods that do not exhibit repetitive motion can be excluded from the further processing because such data does not have the frequency components that correspond to the user activity. If warranted, other filtering may be performed based on other motion characteristics. Next, in 602 an assessment of the motion being experienced by the portable device may be made to determine whether sufficient repetitive changes in device orientation are occurring in some embodiments. For example, activity classification module 136, 236 may identify a user activity have the appropriate characteristics, but other suitable techniques may be employed as warranted. In 604, a check may be performed optionally to determine whether calibration is currently needed and the routine may return to 600 if not. Otherwise, in 606, an estimation of the magnetometer biases may be made by satisfying the selected criterion regarding the distinguished frequency components of the spectrum of magnetic field measurements. As noted above, this may include minimizing frequency components of the squared magnitude of the magnetometer readings that correspond to repetitive user motions, such as stepping or gesturing. Then, in 608, the estimated magnetometer biases are used to correct the obtained magnetic field measurements, by subtracting them or another suitable operation. The calibrated information may then be used for any suitable purpose, including constructing magnetic fingerprint maps as discussed above.

As a further illustration, the following discussion explains suitable operations for an example estimating the magnetometer biases by minimizing the frequency components of the magnitude of magnetic field measurements that correspond to user activity. Specifically, the magnetometer biases $\vec{b}^*$ are found by minimizing an objective function $J(\vec{b})$, where $\vec{b}$ is a 3D vector of magnetometer biases and $\vec{b}^*$ is a bias estimate according to Equation (6):

$$\vec{b}^* = \underset{\vec{b}}{\mathrm{argmin}}\{J(\vec{b})\} \qquad (6)$$

The objective function depends on how bias $\vec{b}$ effects the level of the distinguished frequency components in the frequency spectrum of the magnitude of magnetometer readings. As discussed above, this may represent the stepping motions for a pedestrian, but in other repetitive motions that may be attributed to activities or behaviors of the user may be employed as desired. For example, the objective function can compute total energy of frequency components of steps in some frequency range, where $F_{|\vec{v}-\vec{b}|^2}$ is an estimate of frequency spectrum of the squared magnitude of magnetometer readings $\vec{v}_n$ corrected by a given magnetometer $\vec{b}$, $k_{min}$ is a minimal frequency component and $k_{max}$ is a maximal frequency component, according to Equation (7):
(7)

$$J(\vec{b}) = \sum_{k=k_{min}}^{k_{max}} F_{|\vec{v}-\vec{b}|^2}(k)$$

The sum represented in Equation (7) integrates a frequency spectrum for frequency components from $k_{min}$ and $k_{max}$. Optimization of this objective function or others may include any suitable algorithm, such as gradient methods, coordinate descent algorithms, stochastic programming and others. A range from $k_{min}$ to $k_{max}$ may be determined due to classification of the user activity that was mentioned earlier regarding modules 136 and 236. For example, if the activity classification module identifies that the user activity is pedestrian walking then the range from $k_{min}$ to $k_{max}$ may include several harmonics of the user's step frequency. Taking into consideration that usually a step frequency is about 0.6-0.7 Hz, the spectral components of a frequency range from $f_{min}$=0.6 Hz to $f_{max}$=2.3 HZ may be selected to cover the first three harmonics of the frequency of steps. Determination of a number of the minimal frequency component may be formulated as Equation (8), where $N_S$ is a number of points of a discreet Fourier transform, $F_r$ is a magnetometer sample frequency and brackets define an integer part of a number:

$$k_{min} = \left\lfloor \frac{f_{min} N_s}{F_r} \right\rfloor \qquad (8)$$

A number of the maximal frequency component $k_{max}$ may be found similarly by using $f_{max}$ instead of $f_{min}$ in above formula. Alternatively or in addition, another exemplary objective function is a level of a maximum component in some range of the frequency spectrum according to Equation (9):

$$(J(\vec{b}) = \max_{k \in [k_{min}, k_{max}]} \{F_{|\vec{v}-\vec{b}|}^2(k)\} \qquad (9)$$

Under this formulation, the magnetometer biases may be obtained by satisfying the minimax criterion for Equation (10):

$$\vec{b}^* = \underset{\vec{b}}{\mathrm{argmin}} \max_{k \in [k_{min}, k_{max}]} \{F_{|\vec{v}-\vec{b}|}^2(k)\} \qquad (10)$$

Any suitable method may be employed for estimation of the frequency spectrum $F_{|\vec{v}-\vec{b}|^2}$ that may be expected to include the frequency components that are attributed to repetitive motion of the user. This frequency spectrum may be used in Equations (7)-(10) or in other suitable objective functions depending on the embodiment. Exemplary methods include nonparametric methods, parametric methods, and subspace methods. Among nonparametric methods, illustrative techniques may include periodogram estimates, averaged periodograms of overlapped windowed segments (Welch method), and estimates by combination of multiple orthogonal windows (multi-taper method). An example of parametric spectral estimates is an autoregressive estimate that can be computed by different methods, e.g. Yule-Worker method, Burg's method, etc. Further, subspace methods can be also used for spectral estimate, e.g. by using eigenvector method. Suitable methods of spectral estimate as well as other ones are known in the art, such as the published book by Marple, S. Lawrence. Digital Spectral Analysis. Englewood Cliffs, N.J.: Prentice-Hall, 1987.

As an exemplary illustration, an averaged periodograms estimation suitable for calibrating a magnetometer according to the techniques of this disclosure, the whole sequence of magnetometer readings, N, may be divided by M overlapped segments each containing $N_S$ samples. The spectrum estimation may be written in terms of a sequence of 3D magnetometer readings, $\vec{v}_n$, 0, . . . , N−1, where $w_n$, n=0, . . . , $N_s$−1, is a window function, N is a total amount of raw magnetometer measurements, $N_s$ is an amount of magnetometer measurements of one segment and M is an amount of segments as indicated in Equation (11):

$$F_{|\vec{v}-\vec{b}|^2}(k) = \frac{1}{M} \sum_{m=0}^{M-1} \left| \sum_{n=0}^{N_s-1} w_n \left| \vec{v}_{n+mN_s/2} - \vec{b} \right|^2 e^{-i2\pi \frac{nk}{N_s}} \right|^2,$$

$$k = 0, \ldots, N_s - 1$$

In this equation, the internal sum is a windowed $N_s$-point discreet Fourier transform (DFT) from an m-th segment of the squared magnitude of magnetometer readings $\vec{v}_n$ corrected by a magnetometer bias $\vec{b}$. Further, the external sum in this equation averages squared magnitude of DFT transform of windowed overlapped segments. In the embodiment of Equation (11), 50% overlapping is used, i.e. segments overlap each other by $N_s/2$ samples, however, another percentage of overlapping is also possible. For economy of computations, it may be desirable to choose $N_s$ as a power of two and use a more effective fast Fourier transform (FFT) algorithm instead of DFT. After the magnetometer bias $\vec{b}^*$ is found, the magnetometer readings $\vec{v}_n$, n=0, . . . , N−1 may then be corrected by subtracting the former from the latter as noted above.

Although the above discussion has been in the context of magnetic field measurement from a three-axis magnetometer, the same procedure can be applied to a 2D magnetometer as well with corresponding reduction of dimension of magnetometer readings n=0, . . . , N−1 ($v\_n$)$\rightarrow$, n=0, . . . , N−1. Further, it will be noted that the above techniques involve the magnitude of the magnetic field measurements, representing the sum of all three axis. In other embodiments, the axes may be treated individually or two of the three axes may be combined. The decision of whether to group axes or treat them separately may be predicated on any suitable basis. For example, if the manner in which the user is interacting with the portable device, which may be termed "use case," is known or may be determined, one or more axes might be emphasized and warrant specific attention.

Figure 7:
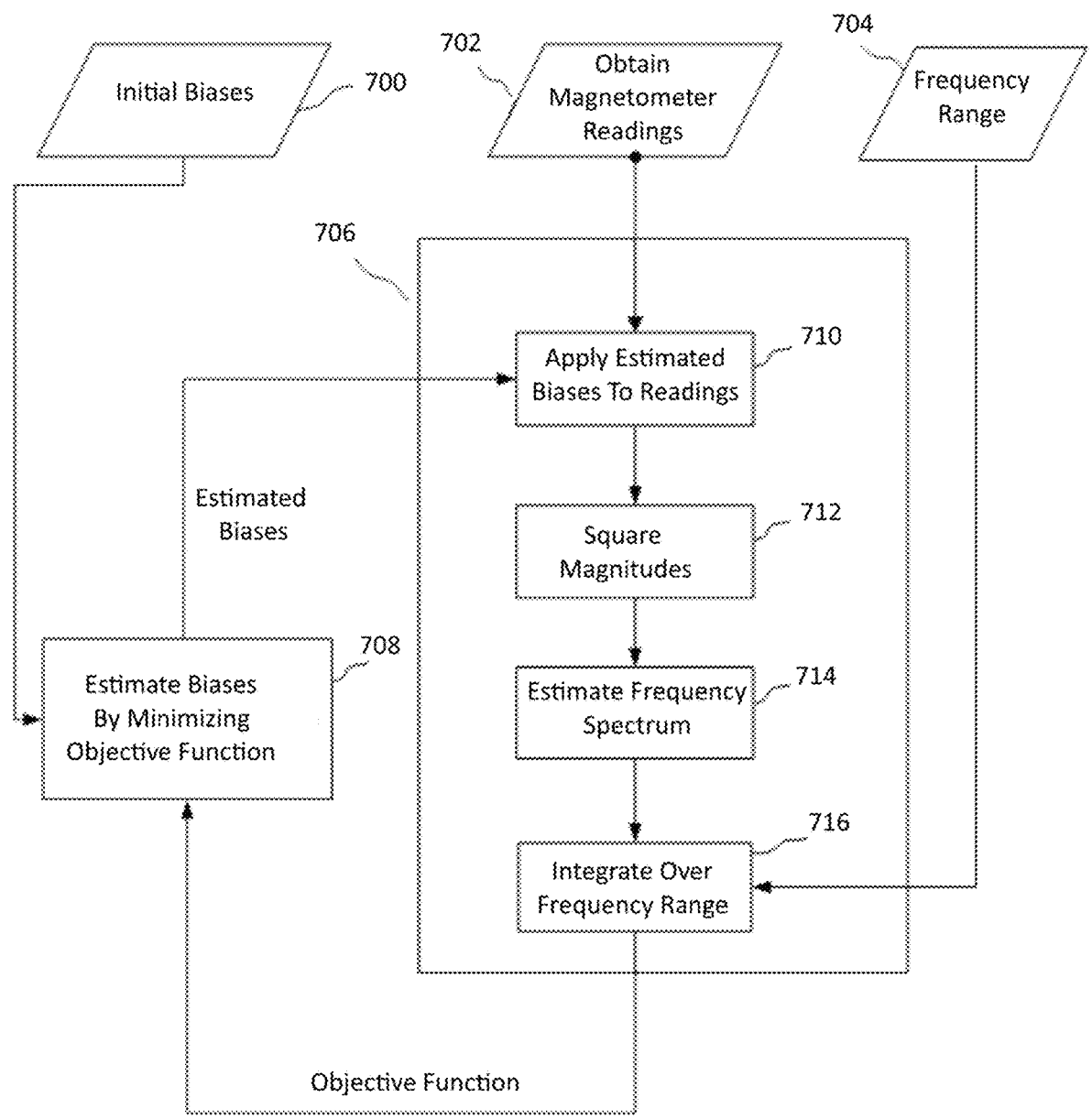
FIG. 7 is a flowchart showing a routine for estimating biases of the magnetometer of a portable device by optimizing an objective function, according to an embodiment.

One suitable implementation for the operations discussed above is schematically represented by the flow chart shown in FIG. 7. Inputs to the routine are any initial values for biases of the magnetometer (if available) as indicated by 700, the magnetic field measurements from the magnetometer as indicated by 702 and a frequency range expected to contain one or more frequency components for which the defined criterion will be satisfied as indicated by 704. An initial value for the magnetometer biases may be available in many cases, e.g. if such a value had been saved after the previous calibration session or by rough estimation before starting optimization procedure. In one embodiment, estimated magnetometer biases are time tagged and saved so that the saved biases are used as an initial value in the optimization procedure of the next calibration session if their time tag is not too old. Use of such initial values may expedite the calibration process. Further, the frequency range expected to contain the frequency components may be based on any available information about the activity in which the user is engaged. For example, activity classification module 136, 236 may determine an activity that involves the requisite repetitive change in device orientation for which a frequency range is expected. In the context of the above description, $\vec{v}_n$, n=0, . . . , N−1 are the magnetometer readings input by 702 and the minimal and maximal frequency component $k_{min}$ and $k_{max}$ are input by 704. Block 706 represents the objective function used to satisfy the criterion, such as by performing the minimization discussed above or other suitable optimization. Thus, optimization of the objective function is performed in 708 to estimate the biases. As indicated, the operation may be recursive, with the estimated biases being used in a subsequent evaluation of the objective function. In this example, this may include using the estimated biases for computing corrected magnetometer readings in 710, calculating the square of the magnitude of the readings in 712, estimating the frequency spectrum of the squared magnitudes in 714 and then integrating the function over the frequency range set by 704 in 716.

Figure 9:
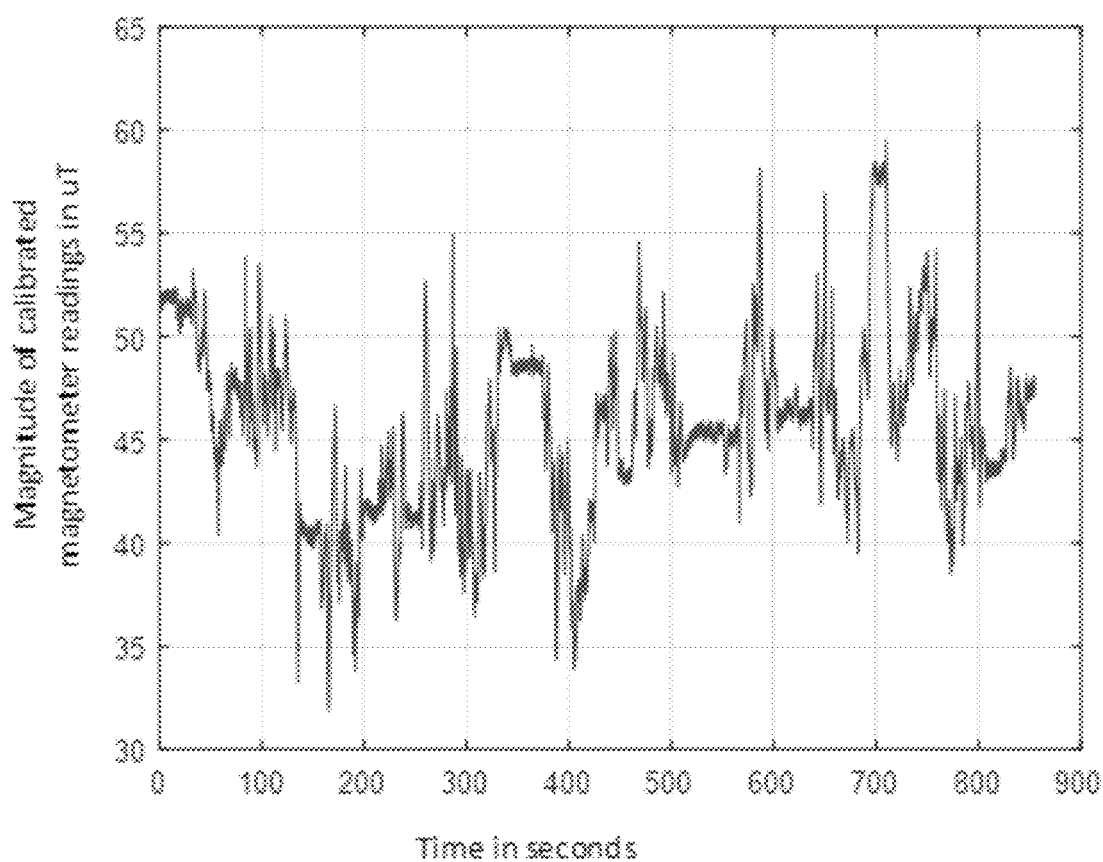
FIG. 9 is a graphical representation of the magnitudes of the measurements following calibration, according to an embodiment.

As an example of these techniques, FIG. 8 schematically depicts the periodogram estimation of the frequency spectrum corresponding to FIG. 5 after calibration of the magnetic field measurements by minimization of Equation (7). As will be appreciated, the distinguished frequency components that correspond to user activity have been effectively removed, indicating the magnetometer readings have been accurately calibrated. Likewise, FIG. 9 graphically depicts the magnitude of the calibrated magnetic field measurements. In comparison with FIG. 3, it may be seen that the relatively low frequency changes due to the changes in the Earth's magnetic field as the user changes location remain, but the relatively high frequency changes that were present in FIG. 4 and were attributable to changes in device orientation caused by repetitive motion of the user are absent in FIG. 9. Again, this indicates that the magnetic field measurements have been accurately calibrated, because the changes in device orientation no longer have the same effect on the magnitude of the magnetometer readings.

Figure 10:
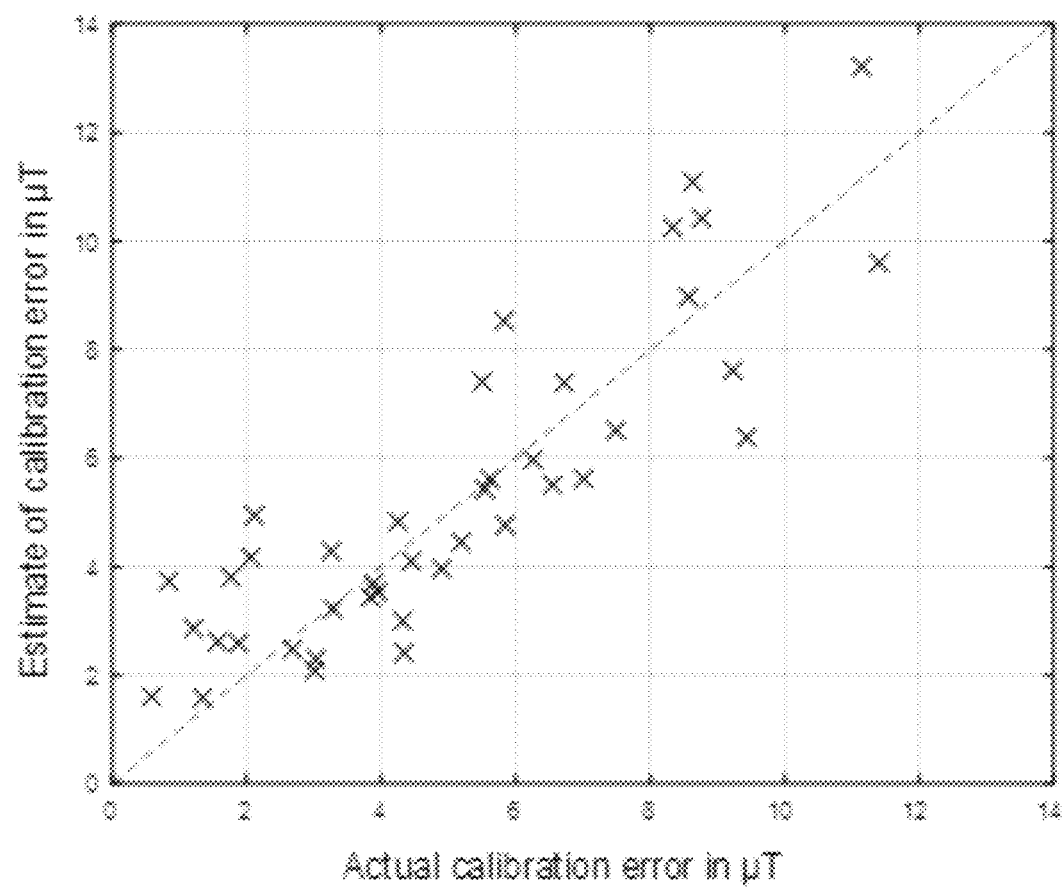
FIG. 10 is a graphical representation comparing the estimation of calibration error by optimization of an objective function to the actual calibration error, according to an embodiment.

To help validate the techniques of this disclosure, tests were performed on magnetic field measurements obtained from a portable device implemented as a smartphone. To obtain reference data, the smartphone was rotated in three orthogonal planes without changing user location so that magnetometer biases could be estimated by the reference method from Freescale's application note AN-4246. To perform the tests, magnetometer readings were collected while the user was walking inside a grocery store with the same smartphone in a left pocket and the magnetometer biases were estimated according to the above disclosure (without using the reference magnetometer biases). Of note, no special or prescribed movements with the phone were performed by the user. The magnetometer sample frequency was 20 Hz and the duration of the walk varied in the different tests from several minutes up to 20 minutes. Averaged periodograms were estimated with 512-point FFT, the Blackman-Harris window function, and 50% overlapping of segments was used to compute frequency spectrum of squared magnitude of magnetometer measurements. A coordinate descent algorithm was used to find magnetometer biases by minimization, Equation (6), of the objective function of Equation (7) in frequency range from 0.6 to 2.3 Hz. As will be appreciated, this range may be expected to include up to third order harmonics of the user's stepping motion, which occurs at approximately 0.6 Hz. The resulting quantities from one test are given in Table 1, while the results of all the tests are graphically depicted in FIG. 10, discussed below. Accordingly, these tests demonstrate that the techniques of this disclosure may be used to accurately estimate magnetometer bias. Importantly, these techniques may be employed after obtaining the magnetic field measurements from an uncalibrated portable device and do not require performing scripted calibration routines that require the user to rotate or otherwise move the portable device through specific orientations.

TABLE 1

| Method of magnetometer calibration | Magnetometer biases, µT | | |
|---|---|---|---|
| | $b_x$ | $b_y$ | $b_z$ |
| Proposed method | 102.77 | 141.45 | 292.32 |
| Reference method | 102.66 | 141.81 | 292.77 |
| Difference | 0.11 | −0.36 | −0.45 |

In some cases, it may be desirable to estimate the accuracy of magnetometer calibration in addition to performing the calibration itself. As will be described below, estimating a magnetometer calibration uncertainty may be based on ratio of the squared magnitude of spectral components of the magnetometer readings at a frequency range corresponding to the repetitive user motion, such as the stepping motion noted above, after applying the estimated magnetometer biases and a sum of frequency spectrum estimates of separate components of calibrated magnetometer readings at the same frequency range.

Different forms of estimation can be derived from an objective function $J(\vec{b})$. For example, for the objective function given in Equation (7), an approximate magnetometer bias error estimation may be obtained from the first terms of the Taylor series representation of $J(\vec{b})$ around an actual bias $\vec{b_0}$. Neglecting low frequency and other less significant components, the following approximate estimate $\widehat{\Delta b}^2$ of squared module of a bias error $\Delta b^2 = |\vec{b^*} - \vec{b_0}|^2$ is given by Equation (12):

$$\widehat{\Delta b}^2 \approx \frac{J(\vec{b^*})}{4 \sum_{k=kmin}^{kmax} \left[ F_{(v_x - b_x^*)}(k) + F_{(v_y - b_y^*)}(k) + F_{(v_z - b_z^*)}(k) \right]} \quad (12)$$

In this equation, $J(\vec{b^*})$ is the objective function according to Equation (7), i.e. sum of magnitude of a component of frequency spectrum of magnetometer readings at frequency range of steps after applying estimated magnetometer bias $\vec{b^*}$ and $F_{(v_x - b_x^*)}(k)$ is a spectral estimate of the x component of magnetometer readings. For example, using the spectral estimate as averaged periodograms of overlapped windowed segments according to Equation (11), the estimation may be written as Equation (13):

$$F_{(v_x - b_x^*)}(k) = \frac{1}{M} \sum_{m=0}^{M-1} \left| \sum_{n=0}^{N-1} w_n (v_{x,n+mN/2} - b_x^*) e^{-i2\pi \frac{nk}{N}} \right|^2, \quad (13)$$

$$k = 0, \ldots, N-1$$

Similarly, spectral estimates of the y and z magnetometer components $F_{(v_y - b_y^*)}(k)$ and $F_{(v_z - b_z^*)}(k)$ may follow Equation (13) with the respective substitution of index x with y or z. The numerator in Equation (12) is a sum of the components of frequency spectrum estimate of magnetometer readings squared magnitude at frequency range of steps after applying estimated magnetometer bias $\vec{b^*}$. Thus, the numerator characterizes the level of spectral components of user motion in calibrated magnetometer readings. Typically, the smaller the numerator indicates less calibration error. On the other hand, the denominator in this formula is a sum of frequency spectrum estimates of separate components of magnetometer readings (x, y, and z), at the same frequency range. The denominator implicitly characterizes the quantity of user motion as the level of spectrum of separate magnetometer components in a frequency range of user motion so that the bigger the denominator, the smaller the calibration error. However, Equation (12) is only one non-limiting example of estimating magnetometer bias error and other variants may be derived as warranted depending on the objective function $J(\vec{b})$, for different types of spectral estimates and by applying different approximations of the objective function. Using these techniques, estimation of the magnetometer bias errors was performed for the tests discussed above, with the results shown in FIG. 10 by graphing the magnetometer bias error estimate $\widehat{\Delta b}^2$ according to Equation (12) against the actual error $\Delta b = |\vec{b^*} - \vec{b_0}|$. As may be seen, the bias error estimate according to Equation (12) can be used to characterize the actual magnetometer bias error. Estimated calibration accuracy can be used to decide if the calibration process is finished. For example, if the accuracy is considered to be acceptable then estimated biases are applied to correct magnetometer readings. Otherwise, obtaining magnetometer readings and their calibration may be continued until reaching desired calibration accuracy.

In another aspect, it may be desirable to perform a periodic estimation of the magnetometer biases. For example, after collecting a subsequent set of magnetometer readings, the magnetometer biases can be estimated and used for correction of uncalibrated magnetometer readings. This calibration may be performed periodically while a user is walking with the portable device, such as to accommodate time variant magnetometer biases. As an illustration, temperature may affect magnetometer bias, so it may be desirable to perform periodic calibration based at least in part on detected temperature changes. In other embodiments, other suitable triggers may be employed to initiate a calibration routine and/or the calibration may be scheduled based on a given period of time elapsing. As yet another illustration, it may be detected that the portable device is miscalibrated using any suitable technique and that condition used to trigger performing a calibration according to the techniques of this disclosure. Further, since the error or uncertainty of the magnetometer bias estimates may be evaluated as described above, the results of one or more periodic calibrations may be omitted and not used for correcting the magnetic field measurements if the associated uncertainty is too great.

Further, magnetometer biases may be estimated by processing serial magnetometer biases estimates. When calibration is performed periodically, an additional processing operation may include applying a recursive filtering procedure (e.g. Kalman filter) to decrease noise and achieve a more smooth estimate of biases. Moreover, the uncertainty of the magnetometer bias may also be used in a filtering procedure.

From the above, it will be appreciated that this disclosure includes a method for automatically calibrating a magnetometer during user activity. The method may involve providing at least one portable device having an integrated sensor for obtaining sensor data comprising magnetic field measurements, wherein the portable device is associated with a user. Magnetic field measurements obtained from the integrated sensor of the portable device while the user was moving may be processed by converting the obtained magnetic field measurements to a frequency domain, distinguishing at least one frequency component in the converted magnetic field measurements that corresponds to the user activity, defining a criterion for the distinguished frequency component and estimating a magnetometer bias by satisfying a condition for the criterion, so that the estimated magnetometer bias may be applied to the obtained magnetic field measurements.

In one aspect, satisfying the condition for the criterion may include optimizing an objective function that relates magnetometer bias to the distinguished frequency component of the converted magnetic field measurement. The optimization of the objective function may be performed iteratively. The objective function may be expressed in terms of a norm of the magnetic field measurements and the optimization comprises a minimization. Minimization of the objective function may reduce higher frequency components relative to lower frequency components.

In one aspect, the objective function may evaluate energy of the higher frequency components, such as the total energy and/or a maximum spectral component in a range of frequencies corresponding to the activity of the user.

In one aspect, the distinguished frequency component may correspond to repetitive change of device orientation. The repetitive change of device orientation may be caused at least in part by a repetitive activity of the user, such as steps taken by the user.

In one aspect, distinguishing the at least one frequency component may include selecting a range of frequencies corresponding to the activity of the user. Selecting the range of frequencies may be based at least in part on output of an activity classification process.

In one aspect, the portable device may be calibrated using the estimated magnetometer bias. The calibration may be based at least in part on output of an activity classification process. The calibration may be based at least in part on a detected temperature change. An accuracy measure of the portable device calibration may be estimated using the objective function and a frequency spectrum estimation of calibrated separate components of magnetic field measurements. As such, calibrating the portable device may be based at least in part on estimated accuracy. The portable device may be calibrated periodically, such as by recursively filtering estimates of magnetometer bias from each period.

In one aspect, the obtained magnetic field measurements may be filtered according to a motion characteristic before processing the obtained magnetic field measurements.

In one aspect, a portion of the operations for processing magnetic field measurements may be performed remotely.

In one aspect, a plurality of portable devices may be provided, each having an integrated sensor for obtaining sensor data comprising magnetic field measurements, wherein each portable device is associated with a user and the magnetic field measurements were obtained while each user moved within environment, wherein the magnetic field measurements from each integrated sensor of each portable device are processed to estimate magnetometer bias for each portable device. A magnetic fingerprint map may be built by applying the estimated magnetometer bias for each portable device to the obtained magnetic field measurements from each portable device to provide corrected magnetic field measurements and correlating the corrected magnetic field measurements with a plurality of locations within the environment.

Further, the techniques of this disclosure may also be implemented in the form of a portable device that performs the automatic calibration locally or as part of system that includes remote processing resources for performing the automatic calibration. A server may also be configured to perform the calibration and/or operations associated with building the magnetic fingerprint map.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for automatically calibrating a magnetometer during user activity, the method comprising:
a) providing at least one portable device having an integrated sensor for obtaining sensor data comprising magnetic field measurements, wherein the portable device is associated with a user;
b) processing magnetic field measurements obtained from the integrated sensor of the portable device during the user activity, wherein the processing comprises:
i) converting the obtained magnetic field measurements to a frequency domain;
ii) distinguishing at least one frequency component in the converted magnetic field measurements that correspond to the user activity;
iii) defining a criterion for the distinguished frequency component; and
iv) estimating a magnetometer bias by satisfying a condition for the criterion; and
c) applying the estimated magnetometer bias to the obtained magnetic field measurements.

2. The method of claim 1, wherein satisfying the condition for the criterion comprises optimizing an objective function that relates magnetometer bias to the distinguished frequency component in the converted magnetic field measurement.

3. The method of claim 2, wherein the objective function is expressed in terms of a norm of the magnetic field measurements and the optimization comprises a minimization.

4. The method of claim 3, wherein minimization of the objective function reduces higher frequency components relative to lower frequency components.

5. The method of claim 2, wherein the objective function evaluates energy of the distinguished frequency component.

6. The method of claim 2, wherein the objective function evaluates a maximum spectral component in a range of frequencies corresponding to the activity of the user.

7. The method of claim 1, wherein the distinguished frequency component corresponds to repetitive change of device orientation.

8. The method of claim 7, wherein the repetitive change of device orientation is caused at least in part by a repetitive activity of the user.

9. The method of claim 8, wherein the repetitive change of device orientation is caused at least in part by steps taken by the user.

10. The method of claim 1, wherein distinguishing the at least one frequency component comprises selecting a range of frequencies corresponding to the activity of the user.

11. The method of claim 10, wherein selecting the range of frequencies is based at least in part on output of an activity classification process.

12. The method of claim 1, further comprising calibrating the portable device using the estimated magnetometer bias.

13. The method of claim 12, wherein calibrating the portable device is based at least in part on output of an activity classification process.

14. The method of claim 12, wherein calibrating the portable device is based at least in part on a detected temperature change.

15. The method of claim 12, further comprising estimating an accuracy measure of the portable device calibration using the objective function and a frequency spectrum estimation of calibrated separate components of magnetic field measurements.

16. The method of claim 12, wherein the portable device is calibrated periodically, further comprising by recursively filtering estimates of magnetometer bias from each period.

17. The method of claim 1, further comprising filtering the obtained magnetic field measurements according to a motion characteristic before processing the obtained magnetic field measurements.

18. The method of claim 1, wherein at least a portion of the operations for processing magnetic field measurements is performed remotely.

19. The method of claim 1, further comprising providing a plurality of portable devices, each having an integrated sensor for obtaining sensor data comprising magnetic field measurements, wherein each portable device is associated with a user and the magnetic field measurements were obtained while each user moved within environment, wherein the magnetic field measurements from each integrated sensor of each portable device are processed to estimate magnetometer bias for each portable device.

20. The method of claim 19, further comprising building a magnetic fingerprint map by applying the estimated magnetometer bias for each portable device to the obtained magnetic field measurements from each portable device to provide corrected magnetic field measurements and correlating the corrected magnetic field measurements with a plurality of locations within the environment.

21. A portable device associated with a user, the portable device comprising an integrated sensor for obtaining sensor data comprising magnetic field measurements during user activity and at least one processor configured to process the magnetic field measurements obtained from the integrated sensor of the portable device to automatically calibrate the integrated sensor by:

a) converting the obtained magnetic field measurements to a frequency domain;

b) distinguishing at least one frequency component in the converted magnetic field measurements that corresponds to the user activity;

c) defining a criterion for the distinguished frequency component; and d) estimating a magnetometer bias by satisfying a condition for the criterion; and wherein the processor is further configured to apply the estimated magnetometer bias to the obtained magnetic field measurements.

22. A server for automatically calibrating a magnetometer, the server comprising at least one processor configured to:

a) receive magnetic field measurements obtained by a portable device having an integrated sensor, wherein the portable device is associated with a user and wherein the magnetic field measurements were obtained from the integrated sensor of the portable device during user activity; and b) process the received magnetic field measurements by:

i) converting the obtained magnetic field measurements to a frequency domain;

ii) distinguishing at least one frequency component in the converted magnetic field measurements that corresponds to the user activity;

iii) defining a criterion for the distinguished frequency component; and iv) estimating a magnetometer bias by satisfying a condition for the criterion.

23. The server of claim 21, wherein the at least one processor is further configured to receive magnetic field measurements obtained by a plurality of portable devices, each having an integrated sensor, wherein each portable device is associated with a user, wherein the magnetic field measurements were obtained from the integrated sensor of each portable device during user activity while each user moved within an environment and wherein magnetic field measurements obtained from each integrated sensor of each portable device are processed to estimate magnetometer bias for each portable device and wherein the at least one processor is further configured to build a magnetic fingerprint map by applying the estimated magnetometer bias for each portable device to the obtained magnetic field measurements from each portable device to provide corrected magnetic field measurements and correlating the corrected magnetic field measurements with a plurality of locations within the environment.

* * * * *